(12) United States Patent
Kong et al.

(10) Patent No.: US 8,990,666 B2
(45) Date of Patent: Mar. 24, 2015

(54) DECODER, METHOD OF OPERATING THE SAME, AND APPARATUSES INCLUDING THE SAME

(75) Inventors: Jae Phil Kong, Seoul (KR); Hwa Seok Oh, Yongin-si (KR); Dong Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 667 days.

(21) Appl. No.: 13/234,130

(22) Filed: Sep. 15, 2011

(65) Prior Publication Data

US 2012/0072809 A1    Mar. 22, 2012

(30) Foreign Application Priority Data

Sep. 16, 2010  (KR) .................. 10-2010-0091068

(51) Int. Cl.
*H03M 13/00* (2006.01)
*G06F 11/10* (2006.01)
*H03M 13/15* (2006.01)

(52) U.S. Cl.
CPC ....... *G06F 11/1008* (2013.01); *H03M 13/1515* (2013.01); *H03M 13/152* (2013.01); *H03M 13/1545* (2013.01); *H03M 13/6502* (2013.01); *G06F 11/108* (2013.01)
USPC .......................................... 714/781; 714/785

(58) Field of Classification Search
USPC ................................................ 714/781, 785
See application file for complete search history.

(56) References Cited

U.S. PATENT DOCUMENTS

| | | | | | |
|---|---|---|---|---|---|
| 4,099,160 | A | * | 7/1978 | Flagg | 714/785 |
| 4,875,211 | A | * | 10/1989 | Murai et al. | 714/784 |
| 5,490,154 | A | * | 2/1996 | Mester | 714/784 |
| 5,586,127 | A | * | 12/1996 | Moriuchi | 714/769 |
| 5,684,810 | A | * | 11/1997 | Nakamura et al. | 714/755 |
| 5,970,075 | A | * | 10/1999 | Wasada | 714/784 |
| 6,122,766 | A | * | 9/2000 | Fukuoka et al. | 714/784 |
| 6,154,869 | A | * | 11/2000 | Wolf | 714/784 |
| 6,317,858 | B1 | * | 11/2001 | Cameron | 714/785 |
| 6,539,516 | B2 | * | 3/2003 | Cameron | 714/785 |
| 6,647,529 | B2 | * | 11/2003 | Hirofuji et al. | 714/784 |
| 6,684,364 | B2 | * | 1/2004 | Cameron | 714/785 |
| 6,735,737 | B2 | * | 5/2004 | Sankaran et al. | 714/782 |
| 6,871,315 | B2 | * | 3/2005 | Seki | 714/782 |
| 7,080,310 | B2 | * | 7/2006 | Cameron | 714/785 |
| 7,106,820 | B2 | * | 9/2006 | Morris | 375/365 |
| 7,661,057 | B2 | * | 2/2010 | McGinnis et al. | 714/784 |
| 2001/0037483 | A1 | * | 11/2001 | Sankaran et al. | 714/782 |
| 2001/0052103 | A1 | * | 12/2001 | Hirofuji et al. | 714/781 |

(Continued)

FOREIGN PATENT DOCUMENTS

JP    2009-212623    9/2009

*Primary Examiner* — Joseph D Torres
(74) *Attorney, Agent, or Firm* — Muir Patent Law

(57) ABSTRACT

A decoder, a method of decoding and systems implementing the same are disclosed. In one example, the method includes calculating syndrome values from input codewords, generating an error location polynomial about the codewords using the syndrome values, determining an error count in the codewords using the error location polynomial, and adjusting power consumption of a circuit in response to the determined error count in the codewords. In one example, a frequency of a clock signal to be provided to a search circuit may be determined based on the error count, and the clock signal may be provided having the determined frequency to a search circuit, such as a Chien search circuit.

14 Claims, 13 Drawing Sheets

(56) References Cited

U.S. PATENT DOCUMENTS

| | | |
|---|---|---|
| 2002/0056067 A1* | 5/2002 | Cameron ................. 714/785 |
| 2002/0146085 A1* | 10/2002 | Morris ................. 375/365 |
| 2003/0145271 A1* | 7/2003 | Cameron ................. 714/781 |
| 2003/0145272 A1* | 7/2003 | Fukuoka et al. ............. 714/784 |
| 2004/0123225 A1* | 6/2004 | Cameron ................. 714/781 |
| 2006/0031742 A1* | 2/2006 | Fukuoka et al. ............. 714/784 |
| 2007/0198903 A1* | 8/2007 | McGinnis et al. ............ 714/784 |
| 2009/0106634 A1 | 4/2009 | Muraoka |
| 2010/0058146 A1 | 3/2010 | Weingarten et al. |

\* cited by examiner

DECODER, METHOD OF OPERATING THE SAME, AND APPARATUSES INCLUDING THE SAME

CROSS-REFERENCE TO RELATED APPLICATIONS

This application claims priority under 35 U.S.C. §119(a) from Korean Patent Application No. 10-2010-0091068 filed on Sep. 16, 2010, the disclosure of which is hereby incorporated by reference in its entirety.

BACKGROUND

The transmission of digital information in a communications system from a transmitter to a receiver through a communications channel may include bit errors due to noise and/or distortion. Bit errors may occur due to transmissions over communications channels, between interconnections between the multitude of interconnected integrated circuit chips on computer boards and/or within the integrated circuits. To overcome this problem of bit errors, error correction encoding and decoding has been used.

The BCH (Bose, Chaudhuri and Hocquenghem) codes may be used for random error correction and used as error correction codes for NAND flash memory. Reed-Solomon (RS) codes, which is a type of BCH code, may be used for burst error correction in hard disks and DVDs.

A method and apparatus for decoding to reduce power consumption is described, and more particularly, a method and apparatus for decoding for reducing power consumption by adjusting a frequency of a clock signal provided to a search according to information on the highest order term of an error location polynomial, a method of operating the decoding apparatus, as well as an apparatus for decoding. The Chien search is one example of the operation of the search although other search algorithms could be used. The Chien search is a fast algorithm for determining roots of polynomials defined over a finite field. The most typical use of the Chien search is in finding the roots of error-locator polynomials encountered in decoding Reed-Soloman (RS) codes and BCH (Bose, Chaudhuri and Hocquenghem) codes. BCH codes form a class of parameterized error-correcting codes. The principal advantage of BCH codes is the ease with which they can be decoded, via an elegant algebraic method known as syndrome decoding.

In error correction using BCH codes, BCH code data may be generated using an encoder and is then decoded using a decoder. At this time, the decoder may calculate syndrome values, generate an error location polynomial using the syndrome values, and calculate the roots of the error location polynomial to detect the positions of error bits.

SUMMARY

Some embodiments described herein provide a decoder for reducing power consumption in response to a complexity of an error correction decoding. A method of operating such a decoder and apparatuses including such a decoder are also disclosed. The complexity of an error correction decoding may be represented by a highest order term of an error location polynomial. The power consumption may be reduced by adjusting a frequency of a clock signal provided to search algorithm hardware, such as a Chien search algorithm hardware.

According to some embodiments, a method of decoding includes calculating syndrome values from input codewords, generating an error location polynomial about the codewords using the syndrome values, determining an error count in the codewords using the error location polynomial, determining the frequency of a clock signal to be provided to search algorithm hardware based on the error count, and providing a clock signal having the determined frequency to the search algorithm hardware.

The error count in the codewords may be determined according to information about a highest order term of the error location polynomial. The determination of the frequency of the clock signal may include changing the frequency of the clock signal to a reference frequency when the current frequency of the clock signal is higher than the reference frequency corresponding to the error count. The determination of the frequency of the clock signal may include maintaining the frequency of the clock signal at the current frequency when the current frequency of the clock signal is equal to or lower than a reference frequency corresponding to the error count.

In another embodiment, the method may further include changing the frequency of the clock signal to an initial value after errors in the codewords are corrected.

According to one embodiment, an apparatus for decoding includes a syndrome calculator configured to calculate syndrome values from input codewords, a key equation solver configured to generate an error location polynomial about the codewords using the syndrome values, and a main control logic configured to determine an error count in the codewords using the error location polynomial and thereafter determine the frequency of a clock signal to be provided to search algorithm hardware based on the error count.

According to one embodiment, the apparatus for decoding may include a clock oscillator configured to generate and provide the clock signal to the search algorithm hardware.

In another embodiment, the main control logic may include frequency adjustment logic configured to determine the frequency of the clock signal based on the error count and generate frequency information from the determined frequency and also include oscillator trimming logic configured to receive the frequency information from the frequency adjustment logic and generate a control signal for controlling the clock oscillator to generate the clock signal based on the frequency information.

According to one embodiment, the frequency adjustment logic may determine the error count in the codewords using information about the highest order term of the error location polynomial. The frequency adjustment logic may change the frequency of the clock signal to a reference frequency when the current frequency of the clock signal is higher than the reference frequency corresponding to the error count.

In yet another embodiment, the frequency adjustment logic may maintain the frequency of the clock signal at a current frequency when the current frequency of the clock signal is equal to or lower than a reference frequency corresponding to the error count. The frequency adjustment logic may change the frequency of the clock signal to an initial value after errors in the codewords are corrected.

According to another embodiment, a memory apparatus includes a flash memory configured to store codewords and a memory controller including a decoder configured to process the codewords. The apparatus for decoding may include a syndrome calculator configured to calculate syndrome values from the codewords, a key equation solver configured to generate an error location polynomial about the codewords using the syndrome values, and a main control logic configured to determine an error count in the codewords using the error location polynomial and determine the frequency of a clock signal to be provided to search algorithm hardware based on the error count.

In another embodiment, an electronic apparatus includes a memory apparatus and a processor configured to control an operation of the memory apparatus. The memory apparatus includes a flash memory configured to store codewords and a memory controller including a decoder configured to process the codewords. The decoder may include a syndrome calculator configured to calculate syndrome values from the codewords, a key equation solver configured to generate an error location polynomial about the codewords using the syndrome values, and a main control logic configured to determine an error count in the codewords using the error location polynomial and determine the frequency of a clock signal to be provided to a search algorithm based on the error count. The electronic apparatus may be a personal computer (PC), a tablet PC, a solid state drive (SSD), or a cellular phone.

In yet another embodiment, the apparatus may include a memory interface, a memory device configured to store codewords, and a memory controller configured to control data exchange between the interface and the memory device. The memory controller may include a decoder configured to process the codewords. The decoder may include a syndrome calculator configured to calculate syndrome values from the codewords, a key equation solver configured to generate an error location polynomial about the codewords using the syndrome values, and a main control logic configured to determine an error count in the codewords using the error location polynomial and determine a frequency of a clock signal to be provided to search algorithm hardware based on the error count.

According to another embodiment, the apparatus may include a plurality of memory systems configured to form a redundant array of independent disks (RAID) array and a RAID controller configured to control operations of the plurality of memory systems. Each of the memory systems may include a plurality of memory devices configured to store codewords and a memory controller configured to control operations of the memory devices and include a decoder configured to process the codewords. The decoder may include a syndrome calculator configured to calculate syndrome values from the codewords, a key equation solver configured to generate an error location polynomial about the codewords using the syndrome values, and a main control logic configured to determine an error count in the codewords using the error location polynomial and determine the frequency of a clock signal to be provided to search algorithm hardware based on the error count. Each of the memory systems may be a Solid State Drive (SSD).

In another embodiment, a frequency comparison circuit 700 may include a comparator 710 to compare the current highest order term of the error location polynomial with the previous highest order term of the error location polynomial to step down the frequency of the clock signal via an oscillator step logic circuit 720 and oscillator logic circuit 730 to provide a clock signal CLK to clock oscillator 50.

In yet another embodiment, the apparatus may be used to adjust the frequency of a clock signal based on errors in an integrated circuit.

According to another embodiment, the apparatus may be used to adjust the frequency of a clock signal based on errors in the communications between integrated circuit chips on a computer board.

In another embodiment, the method may be used to adjust the frequency of a clock signal based on errors in an integrated circuit.

According to another embodiment, the method may be used to adjust the frequency of a clock signal based on errors in the communications between integrated circuit chips on a computer board.

BRIEF DESCRIPTION OF THE DRAWINGS

Exemplary embodiments will be more clearly understood from the following detailed description taken in conjunction with the accompanying drawings.

DETAILED DESCRIPTION OF THE EMBODIMENTS

Figure 1:
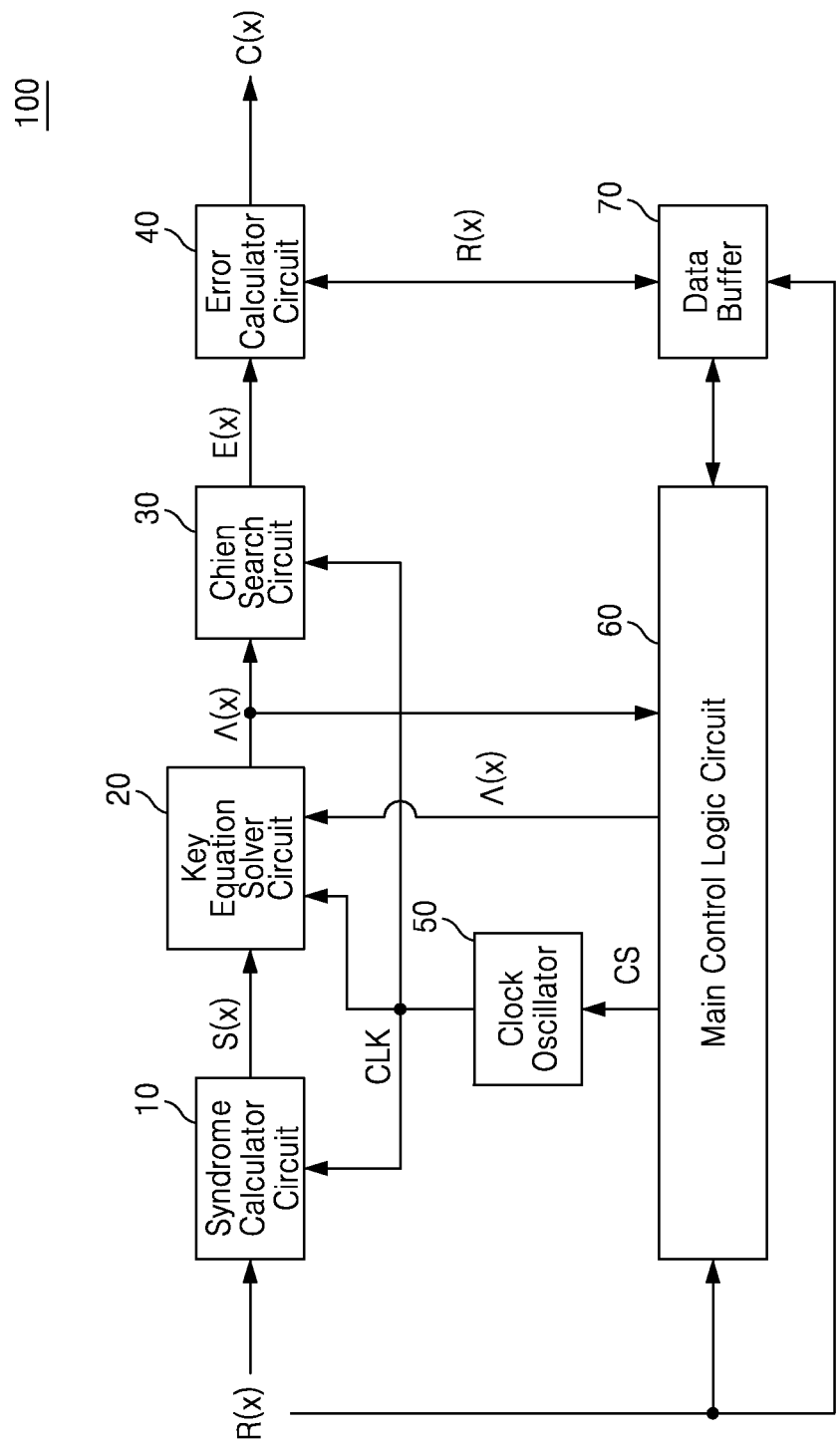
FIG. 1 is a block diagram of a decoder according to some embodiments.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a decoder 100 according to one example The decoder 100 may be used as a BCH decoder and includes a syndrome calculator circuit 10, a key equation solver circuit 20, a Chien search circuit 30, an error corrector circuit 40, a clock oscillator 50, and main control logic circuit 60. The decoder 100 may be formed as an integrated circuit in a semiconductor chip. The decoder 100 may be formed integrally on a single semiconductor memory chip with a memory, such as a non-volatile memory, non-volatile NAND flash memory and/or 3D NAND flash memory (such as U.S. Pat. No. 7,679,133, which is hereby incorporated by reference in its entirety). The decoder 100 may be formed on a semiconductor chip separate from data that the decoder 100 corrects errors, such as separate from a memory storing the data that decoder 100 corrects. For example, the decoder 100 may be formed in a first integrated circuit (e.g., a memory controller integrated circuit semiconductor chip, a master interface integrated circuit semiconductor chip, and/or a master memory semiconductor chip) in communication with a second integrated circuit (e.g., a separate memory integrated circuit semiconductor chip) storing data that the decoder 100 corrects. If the decoder 100 is formed on a separate semiconductor chip from one or more second memory semiconductor chips storing data on which the decoder 100 performs error correction, the first and second semiconductor chips may be packaged together in a single semiconductor package (e.g., side by side, stacked or having a package on package (POP) configuration). The decoder 100 and/or each of its circuits 10, 20, 30, 40, 50 and 60, may be implemented in whole or in part by general purpose computer hardware configured by software, firmware, and/or dedicated circuitry specifically designed for performing error correction operations.

The syndrome calculator circuit 10 calculates syndrome values S(x) from codewords R(x) received from a memory 5. The syndrome values S(x) are used to solve a key equation.

When the syndrome values S(x) are all 0, that is, when there is no error in the received codewords R(x), the codewords R(x) stored in a data buffer are output without error correction. When all of the syndrome values S(x) are not 0, the key equation solver circuit 20 using a Berlekamp-Massey algorithm or a Euclidean algorithm generates and outputs an error location (or locator) polynomial Λ(x) from the syndrome values S(x) in order to solve a key equation.

The Chien search circuit 30 calculates error positions from the error location polynomial Λ(x) using a Chien search and generates an error polynomial E(x). The coefficients of the error polynomial E(x) may be the positions and the values of errors. BCH codewords and/or use of a Chien search circuit 30 is only one example of the decoding scheme and search circuit 30, and other decoding and/or search hardware may be implemented. The Chien search circuit 30 may determine roots of polynomials. The Chien search circuit 30 may be used to find the roots of error-locator polynomials encountered in error decoding, such as decoding Reed-Solomon (RS) codes, BCH (Bose, Chaudhuri and Hocquenghem) codes and/or error-correcting codes which may be decoded via algebraic method known as syndrome decoding. Examples of a BCH decoder circuit (including a Chien search circuit) and associated methods may be found in U.S. Pat. No. 7,406,651, which is hereby incorporated by reference in its entirety.

The error corrector circuit 40 corrects the errors of the codewords R(x) based on the error positions and the error values output from the Chien search circuit 30 and outputs error-corrected codewords C(x). When receiving the error polynomial E(x) from the Chien search circuit 30, the error corrector circuit 40 receives the codewords R(x) from the data buffer 70 controlled by the main control logic circuit 60. The error corrector circuit 40 corrects the errors of the codewords R(x) using the error polynomial E(x) and to output the error-corrected codeword C(x).

The clock oscillator 50 is controlled by the main control logic circuit 60 to provide a clock signal to the syndrome calculator circuit 10, the key equation solver circuit 20, and the Chien search circuit 30. The clock oscillator 50 may change the frequency of the clock signal in response to a control signal CS output from the main control logic circuit 60.

The clock oscillator 50 may generate a clock signal having a predetermined initial frequency when the decoder 100 is activated. When the initial frequency is changed to a reference frequency by the main control logic circuit 60, the clock oscillator 50 may generate a clock signal CLK having the reference frequency. The clock signal CLK may be provided to one or more of the syndrome calculator circuit 10, the key equation solver circuit 20, the Chien search circuit 30, the error corrector circuit 40, the main control logic circuit 60 and the data buffer 70. The decoder 100 of FIG. 1 illustrates the clock signal CLK being provided to the syndrome calculator circuit 10, the key equation solver circuit 20 and the Chien search circuit 30.

The data buffer 70 may store the codewords R(x), the syndrome values S(x) calculated by the syndrome calculator circuit 10, and the error location polynomial Λ(x) generated by the key equation solver circuit 20. The data buffer 70 may also receive the codewords R(x) input to the decoder 100 via the main control logic circuit 60.

Figure 2:
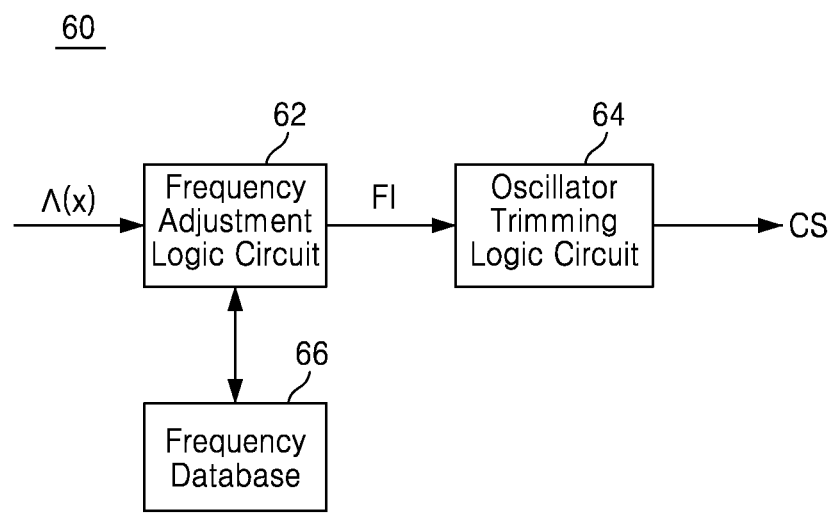
FIG. 2 is a block diagram of main control logic illustrated in FIG. 1.

FIG. 2 is a block diagram of the main control logic circuit 60 illustrated in FIG. 1. Referring to FIGS. 1 and 2, the main control logic circuit 60 includes a frequency adjustment logic circuit 62 and an oscillator trimming logic circuit 64 and may also include a frequency database 66.

The frequency adjustment logic circuit 62 determines the frequency of a clock signal to be generated by the clock oscillator 50. The frequency adjustment logic circuit 62 generates information about the frequency of the clock signal to be generated by the clock oscillator 50, i.e., frequency information FI and transmits the frequency information FI to the oscillator trimming logic circuit 64.

The oscillator trimming logic circuit 64 receives the frequency information FI from the frequency adjustment logic circuit 62 and generates the control signal CS (which may comprise a plurality of individual signals) for controlling the operation of the clock oscillator 50 based on the frequency information (FI). The clock oscillator 50 inputs the control signal CS and outputs a clock signal CLK having a frequency responsive to the control signal CS. As is known in the art, the clock oscillator 50 may adjust the frequency of the clock signal CLK by adjusting the resistance and/or capacitance of an internal load of the clock oscillator. The oscillator trimming logic 64 may transmit to the clock oscillator 50 a plurality of control signals for respectively controlling a plurality of switches respectively connecting the resistors with the capacitors.

Let's assume, for instance, the clock oscillator 50 generates a 100 Hz clock signal when the total resistance of the resistors included in the clock oscillator 50 is 10Ω. At this time, the oscillator trimming logic 64 may transmit to the clock oscillator 50 control codes, e.g., binary signals of "0000", "0001", "0010", and "0011", for controlling on/off signals for the switches respectively connected to the resistors so that the total resistance of the resistors included in the clock oscillator 50 can be 10Ω and the clock oscillator 50 can generate the clock signal having the 100 Hz.

The frequency database 66 may store information (hereinafter, referred to as "error count information") about the number of errors based on the error location polynomial Λ(x) output from the key equation solver circuit 20 and information (hereinafter, referred to as "frequency information") about the frequency of the clock signal corresponding to the number of errors. The frequency database 66 may store the error count information and the frequency information in a frequency mapping table.

Table 1 shows an example of the frequency mapping table. Table 1 includes frequency information corresponding to an item of error count information.

TABLE 1

| Error count information | Frequency information |
|---|---|
| 1~5 | 100 |
| 6~10 | 90 |
| 11~15 | 80 |
| 16~20 | 70 |
| 21~25 | 60 |
| 26~30 | 50 |

Referring to Table 1, the frequency adjustment logic circuit 62 of the main control logic circuit 60 determines the frequency information of a clock signal to be generated by the clock oscillator 50 based on the error count information. In addition, the frequency adjustment logic circuit 62 compares a frequency (hereinafter, referred to as a "first reference frequency") corresponding to an error count with a frequency (hereinafter, referred to as a "current frequency") of a clock signal currently generated by the clock oscillator 50 of the decoder 100. The current frequency may be an initial frequency generated by the clock oscillator 50 upon the activation of the decoder 100. When the current frequency is higher than the first reference frequency, the main control logic circuit 60 changes the frequency of a clock signal to be generated by the clock oscillator 50 to the first reference frequency with reference to the frequency mapping table.

For instance, when the error count information is "7" and the current frequency of the clock signal generated by the clock oscillator 50 is "100", the main control logic circuit 60 adjusts the frequency of a clock signal to be generated by the clock oscillator 50 to "90". When the error count information is "3" and the current frequency is "100", the main control logic circuit 60 maintains the frequency of the clock signal to be generated by the clock oscillator 50 at the current frequency, "100".

As described above, the error count information and the frequency information may be inversely proportional to each other. In other words, as the error count increases, the first reference frequency decreases. When the initial frequency of a clock signal generated by the clock oscillator 50 is the maximum frequency of the clock signal, the frequency adjustment logic circuit 62 may adjust the frequency of the clock signal to be inversely proportional to the error count. For instance, the frequency adjustment logic circuit 62 may adjust the frequency to "90" when the error count information is "7" and to "60" when the error count information is "23", as shown in Table 1.

Alternatively, the frequency mapping table may include information (hereinafter, referred to as a "highest order term information") about the highest order term of the error location polynomial Λ(x) output from the key equation solver circuit 20 and information (hereinafter, referred to as a "frequency information") about the frequency of a clock signal corresponding to the highest order term, as shown in Table 2.

TABLE 2

| Highest order term information | Frequency information |
|---|---|
| 1~3 | 70 |
| 4~6 | 65 |
| 7~9 | 60 |
| 10~12 | 55 |
| 13~15 | 50 |
| 16~18 | 45 |

Referring to Table 2, the frequency adjustment logic circuit 62 of the main control logic circuit 60 determines the frequency of a clock signal to be generated by the clock oscillator 50 based on the highest order term information of the error location polynomial Λ(x) generated by the key equation solver 20. In addition, the frequency adjustment logic circuit 62 compares a frequency (hereinafter, referred to as a "second reference frequency") corresponding to the highest order term of the error location polynomial Λ(x) with the current frequency of the clock signal generated by the clock oscillator 50 of the decoder 100. When the current frequency is higher than the second reference frequency, the main control logic circuit 60 changes the frequency of a clock signal to be generated by the clock oscillator 50 to the second reference frequency with reference to the frequency mapping table.

For instance, when the highest order term is "13" and the current frequency of the clock signal generated by the clock oscillator 50 is "70", the main control logic circuit 60 adjusts the frequency of a clock signal to be generated by the clock oscillator 50 to "50". When the highest order term is "2" and the current frequency is "70", the main control logic circuit 60 maintains the frequency of the clock signal to be generated by the clock oscillator 50 at the current frequency, "70".

When the frequency of the clock signal to be generated by the clock oscillator 50 is adjusted by the main control logic circuit 60, power consumption for the Chien search based on an error count, that is, the power consumption of the Chien search circuit 30 calculating error positions from the error location polynomial Λ(x) can be reduced.

The Chien search circuit 30 receives the clock signal generated by the clock oscillator 50 and calculates error positions in synchronization with the frequency of the clock signal. At this time, when the highest order term in the error location polynomial Λ(x) increases, the error count increases, and therefore, the amount of computation of the Chien search circuit 30 calculating the error location polynomial Λ(x) rapidly increases. As a result, the power consumption of a plurality of circuits (not shown) included in the decoder 100 may also increase.

In some embodiments, however, the main control logic circuit 60 adjusts the frequency of the clock signal generated by the clock oscillator 50, thereby reducing the calculation speed of the Chien search circuit 30 calculating the error positions according to the frequency of the clock signal. When the calculation speed of the Chien search circuit 30 is reduced, the computational processing of the decoder 100 is prevented from rapidly increasing. As a result, the power consumption of the decoder 100 apparatus for decoding is reduced.

In alternative embodiments, in place of or in addition to the adjustment of the frequency of the clock signal CLK provided to the Chien search circuit 30, other power reduction commands may be issued by the main control logic circuit 60. For example, (a) the main control logic circuit 60 may provide control signals to reduce an operating speed of a memory connected to provide codewords R(x); (b) the main control logic circuit 60 may issue a command to stop or slow background operations whose timing may be delayed without notice to a user (e.g., such as delaying or temporarily stopping block management schemes in flash memory, which may include erasure of dirty blocks to create free blocks to make available for future write operations); and/or (c) the main control logic circuit 60 may issue a command to reduce power consumption to system component in addition to or instead of the memory device and/or decoder 100, such as reduction of brightness of a display of the system.

Figure 3:
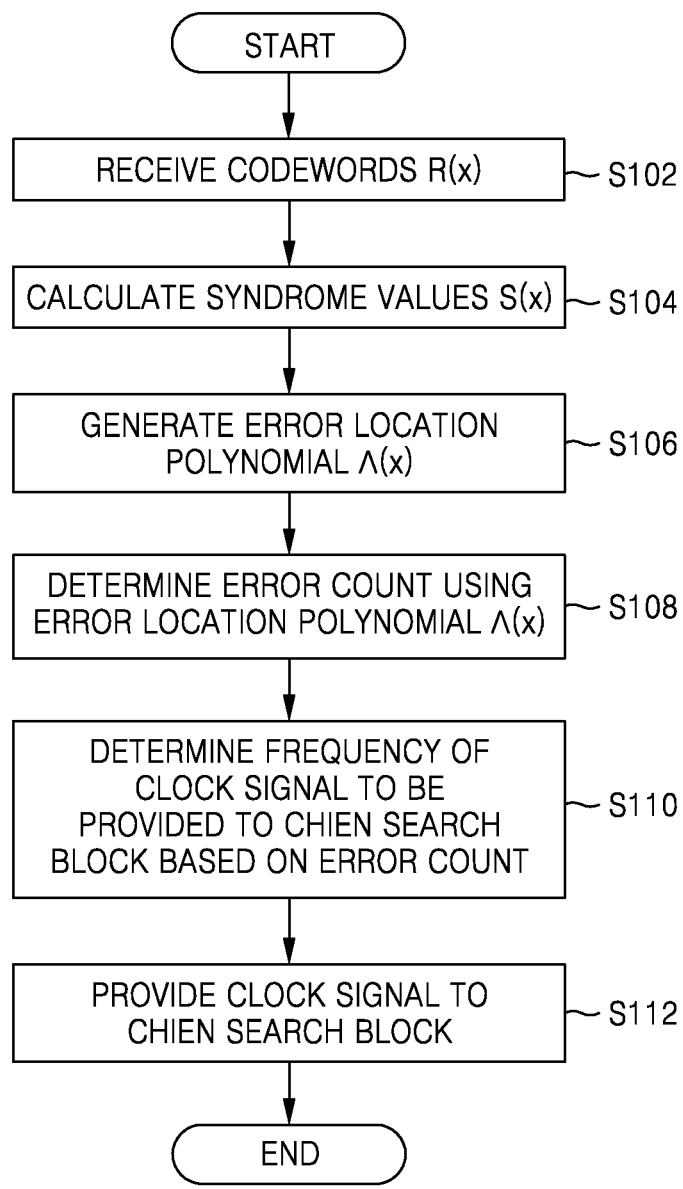
FIG. 3 is a flowchart illustrating a method of decoding.

FIG. 3 is a flowchart of illustrating a method of decoding. The method may be implemented by the decoder 100 illustrated in FIG. 1. Referring to FIGS. 1 and 3, when the decoder 100 receives the codewords R(x) in operation S102, the syndrome calculator circuit 10 calculates the syndrome values S(x) in operation S104. The syndrome values S(x) calculated by the syndrome calculator circuit 10 are transmitted to the key equation solver circuit 20 and the key equation solver circuit 20 generates the error location polynomial Λ(x) from the syndrome values S(x) in operation S106.

The main control logic circuit 60 determines an error count using the error location polynomial Λ(x) generated by the key equation solver circuit 20 in operation S108 and then determines the frequency of a clock signal to be provided to the Chien search circuit 30 based on the error count in operation S110. The clock oscillator 50 generates a clock signal having the determined frequency and provides the clock signal to the Chien search circuit 30 in operation S112. The clock signal may be used as an operating clock signal for the syndrome calculator circuit 10, the key equation solver circuit 20, and the Chien search circuit 30.

Figure 4:
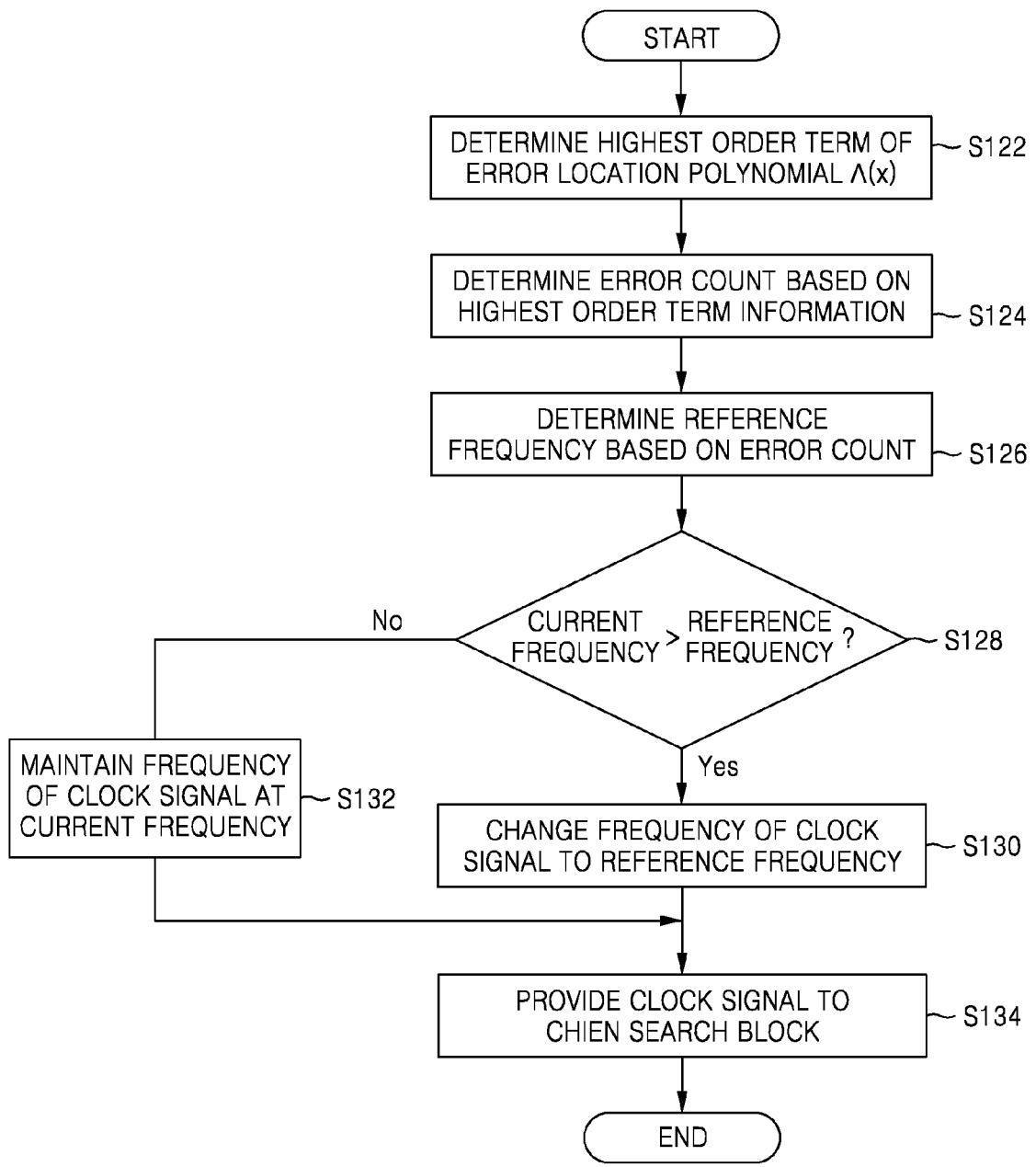
FIG. 4 is a flowchart illustrating the method of determining the frequency of a clock signal to be generated by a clock oscillator using the main control logic

FIG. 4 is a flowchart of an operation of determining the frequency of the clock signal to be generated by the clock oscillator 50, which may be implemented using the main control logic circuit 60 in the method illustrated in FIG. 3. FIG. 4 shows operations performed after the error location polynomial Λ(x) is generated by the key equation solver circuit 20. Referring to FIGS. 1 through 4, the frequency adjustment logic circuit 62 of the main control logic circuit 60 determines the highest order term of the error location polynomial Λ(x) in operation S122 and determines an error count based on highest order term information in operation S124.

Thereafter, in operation S126, the frequency adjustment logic circuit 62 determines a reference frequency based on the error count. At this time, the frequency adjustment logic circuit 62 may determine the reference frequency based on the error count in operation S124 with reference to a frequency mapping table stored in the frequency database 66.

The frequency adjustment logic circuit 62 compares a current frequency with the reference frequency in operation S128. When the current frequency is higher than the reference frequency, the frequency adjustment logic circuit 62 changes the frequency of the clock signal to the reference frequency in operation S130. When the current frequency is not higher than the reference frequency, that is, when the current frequency is equal to or lower than the reference frequency, the frequency adjustment logic circuit 62 may maintain the frequency of the clock signal at the current frequency in operation S132. Alternatively, when the current frequency is lower than the reference frequency, the frequency adjustment logic circuit 62 may increase the frequency of the clock signal to the reference frequency in operation S132.

When the frequency of the clock signal to be provided to the Chien search circuit 30 is determined, the oscillator trimming logic circuit 64 generates the control signal CS for controlling the clock oscillator 50 to generate a clock signal having the determined frequency. The clock oscillator 50 generates the clock signal having the determined frequency in response to the control signal CS and provides the clock signal to the Chien search circuit 30 in operation S134.

Figure 5:
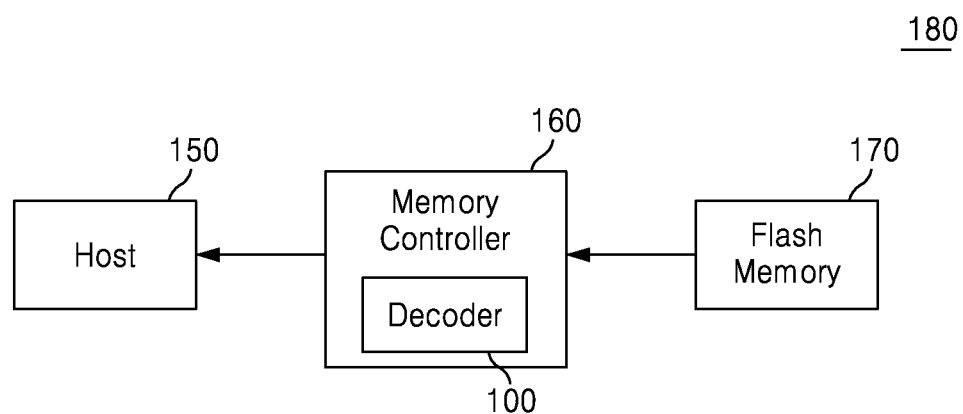
FIG. 5 is a block diagram of a data transceiver system including the decoder illustrated in FIG. 1.

FIG. 5 is a block diagram of a data transceiver system 180 including the decoder 100 illustrated in FIG. 1. The data transceiver system 180 includes a host 150, a memory controller 160, and a non-volatile memory, e.g., a flash memory 170. The codewords R(x) output from the flash memory 170 are input to the decoder 100 included in the memory controller 160. The memory controller 160 and the flash memory 170 form a memory device. When the codewords R(x) are decoded by the decoder 100, the memory controller 160 transmits decoded data to the host 150.

Figure 6:
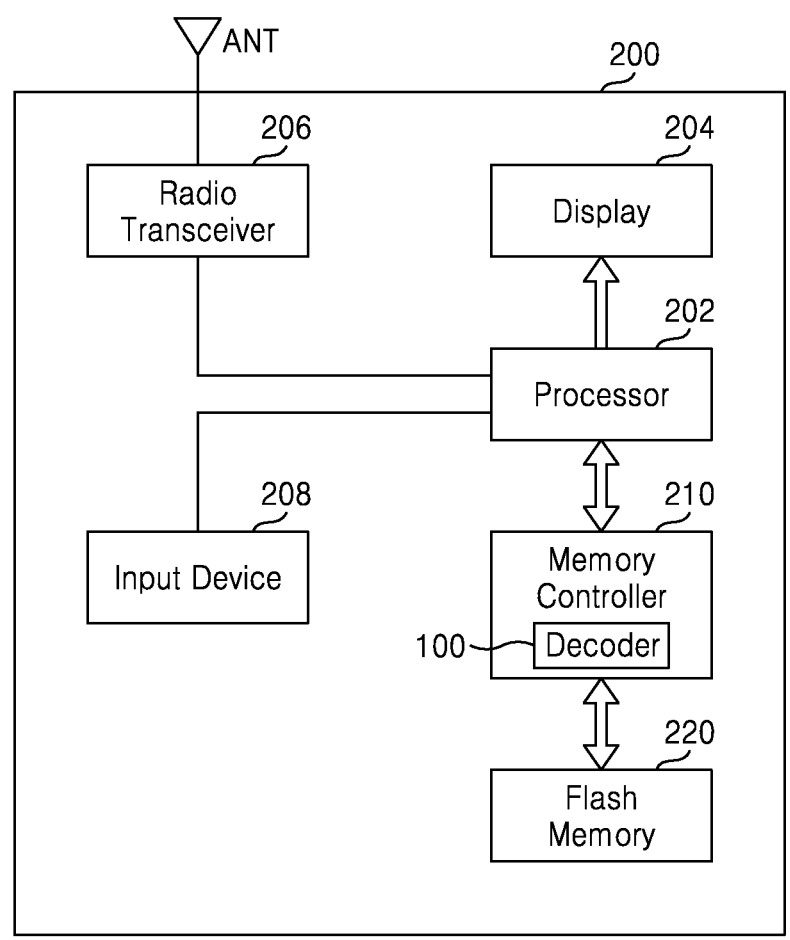
FIG. 6 is a block diagram of an electronic communication apparatus including the decoder illustrated in FIG. 1.

FIG. 6 is a block diagram of an electronic apparatus 200 including the decoder 100 illustrated in FIG. 1 according to some embodiments of the present invention. Referring to FIG. 6, the electronic apparatus (or device) 200 may be a cellular phone, a smart phone, tablet PC, or a wireless Internet device and may include a flash memory 220 and a memory controller 210 controlling the operation of the flash memory 220. The memory controller 210 may be controlled by a processor 202 controlling the overall operation of the electronic apparatus 200. The memory controller 210 includes the decoder 100 processing the codewords R(x) output from the flash memory 220. Data stored in the flash memory 220 or processed by the decoder 100 may be controlled by the processor 202 to be displayed through a display 204.

The electronic communication apparatus 200 may also include a radio transceiver 206. The radio transceiver 206 may transmit and receive radio signals to and from the outside through an antenna ANT. The radio transceiver 206 may convert radio signals received through the antenna ANT into signals that can be processed by the processor 202. Accordingly, the processor 202 may process the signals output from the radio transceiver 206 and store processed signals in the flash memory or display the processed signal through the display 204. The radio transceiver 206 may also convert signals output from the processor 202 into radio signals and transmit the radio signals to the outside through the antenna ANT.

The electronic communication apparatus 200 may also include an input device 208 which enables control signals for controlling the operations of the processor 202 or data to be processed by the processor 202 from the input device 208. The input device 208 may be a pointing device such as a touch pad or a computer mouse, a keypad, or a keyboard. The processor 202 may control the display 204 to display data output from the flash memory 220, radio signals output from the radio transceiver 206, or data output from the input device 208.

Figure 7:
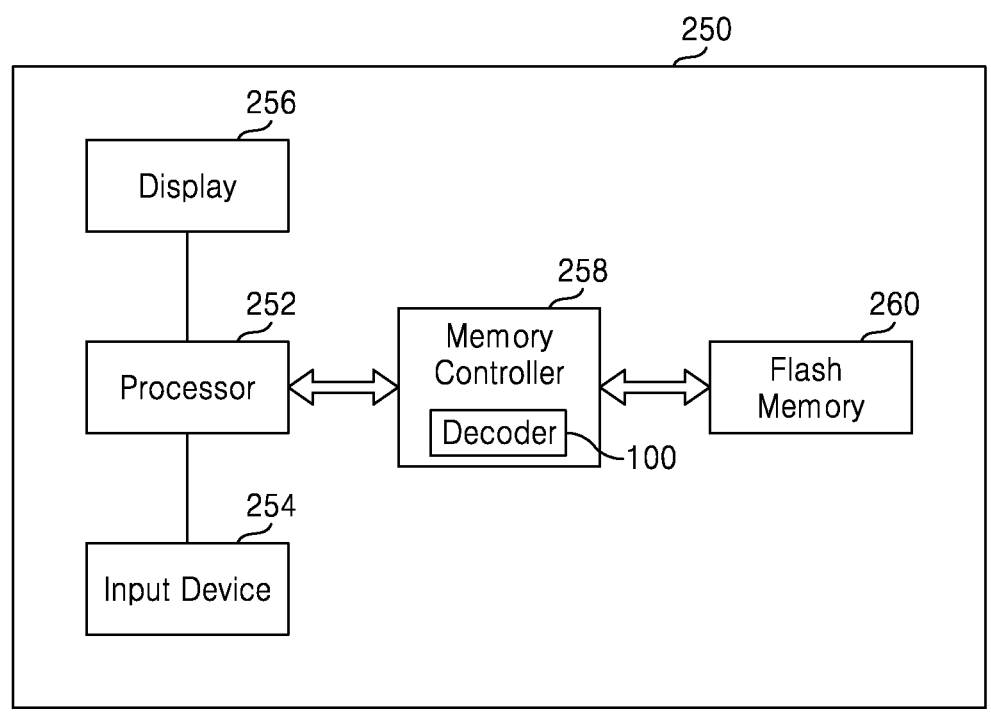
FIG. 7 is a block diagram of an electronic apparatus including the decoder illustrated in FIG. 1.

FIG. 7 is a block diagram of an electronic processing apparatus 250 including the decoder 100 illustrated in FIG. 1 according to other embodiments. Referring to FIG. 7, the electronic processing apparatus 250 may be a data processing apparatus such as a personal computer (PC), a tablet PC, a laptop computer, an e-reader, a personal digital assistant (PDA), a portable multimedia player (PMP), an MP3 player, or an MP4 player. The electronic processing apparatus 250 includes a flash memory 260 and a memory controller 258 controlling the operations of the flash memory 260. The memory controller 258 includes the decoder 100 processing the codewords R(x) output from the flash memory 250.

The electronic processing apparatus 250 may also include a processor 252 controlling the overall operation of the electronic processing apparatus 250. The memory controller 258 is controlled by the processor 252. For instance, the memory controller 258 may control the decoder 100 to process the codewords R(x) in compliance with the processor 252.

The processor 252 may display data stored in the flash memory 260 through a display 256 in response to an input signal generated by an input device 254. The input device 254 may be implemented by a pointing device such as a touch pad or a computer mouse, a keypad, or a keyboard.

Figure 8:
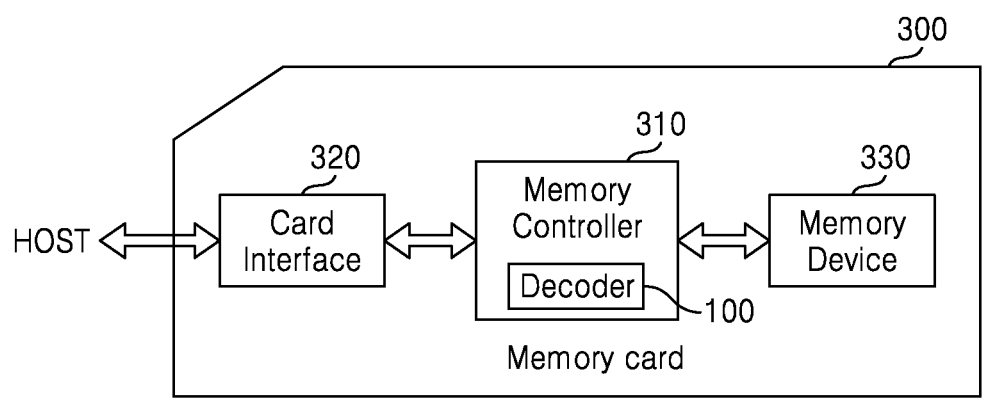
FIG. 8 is a block diagram of an electronic card apparatus including the decoder illustrated in FIG. 1.

FIG. 8 is a block diagram of an electronic card apparatus 300 including the decoder 100 illustrated in FIG. 1 according to further embodiments. Referring to FIG. 8, the electronic card apparatus 300 may be a memory card, a smart card, or a universal serial bus (USB) flash drive and includes a memory device 330, a memory controller 310 including the decoder 100, and a card interface 320.

The memory controller 310 may control data exchange between the memory device 330 and the card interface 320. The card interface 320 may be a secure digital (SD) card interface or a multi-media card (MMC) interface or any other memory type device. The card interface 320 may interface data between a host and the memory controller 310 according to a communication protocol of the host that can communicate with the electronic card apparatus 300.

When the electronic apparatus 300 is connected to a host such as a computer, a digital camera, a digital audio player, a cellular phone, a consol video game hardware, or a digital set-top box, the electronic apparatus 300 may transmit or receive data stored in the memory device 330 to or from host through the card interface 320 and the memory controller 310.

Figure 9:
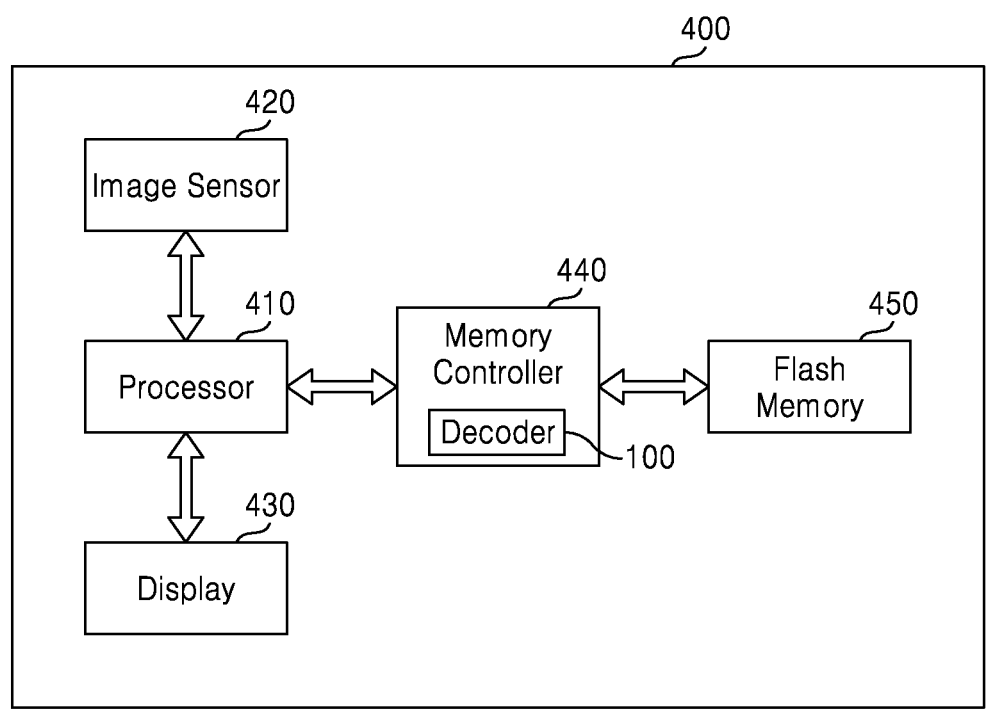
FIG. 9 is a block diagram of an electronic image apparatus including the decoder illustrated in FIG. 1.

FIG. 9 is a block diagram of an electronic image apparatus 400 including the decoder 100 illustrated in FIG. 1 according to other embodiments. Referring to FIG. 9, the electronic image apparatus 400 includes a flash memory 450, a memory controller 440 controlling the data processing operation of the flash memory 450, and a processor 410 controlling the overall operation of the electronic image apparatus 400. The memory controller 440 includes the apparatus for decoding processing the codewords R(x) output from the flash memory 450.

The electronic image apparatus 400 may also include an image sensor 420. The image sensor 420 converts an optical image into a digital signal. The digital signal is controlled by the processor 410 to be stored in the flash memory 450 or displayed through a display 430. In addition, the digital signal stored in the flash memory 450 is controlled by the processor 410 to be displayed through the display 430.

Figure 10:
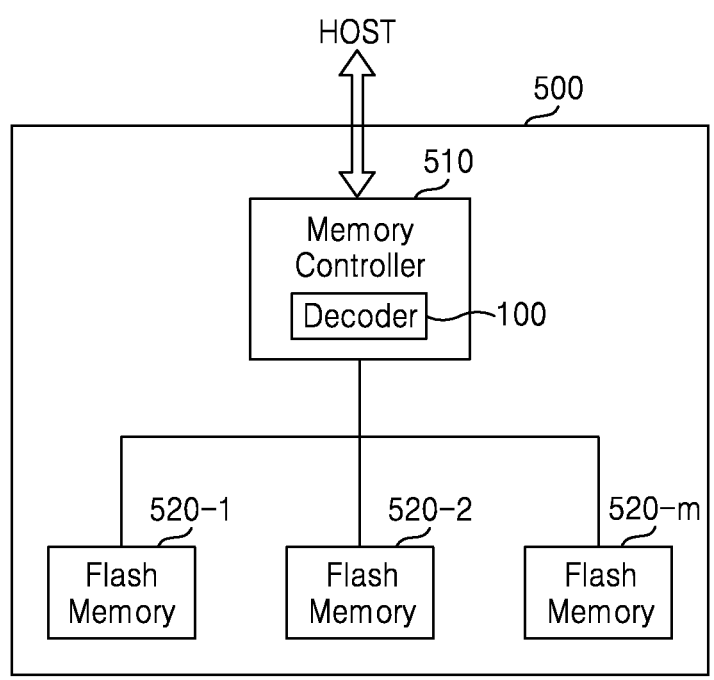
FIG. 10 is a block diagram of an electronic memory apparatus including the decoder illustrated in FIG. 1.

FIG. 10 is a block diagram of an electronic memory apparatus 500 including the decoder 100 illustrated in FIG. 1 according to yet other embodiments. The electronic apparatus 500 may be a data storage device such as a solid state drive (SSD). The electronic apparatus 500 includes a plurality of flash memories 520-1 through 520-$m$ and a memory controller 510 controlling the data processing operation of the flash memories 520-1 through 520-$m$. The electronic memory apparatus 500 may be implemented as a memory system or a memory module.

The memory controller 510 may be provided inside or outside the electronic memory apparatus 500. The memory controller 510 includes the decoder 100 processing the codewords R(x) output from the flash memories 520-1 through 520-$m$.

Figure 11:
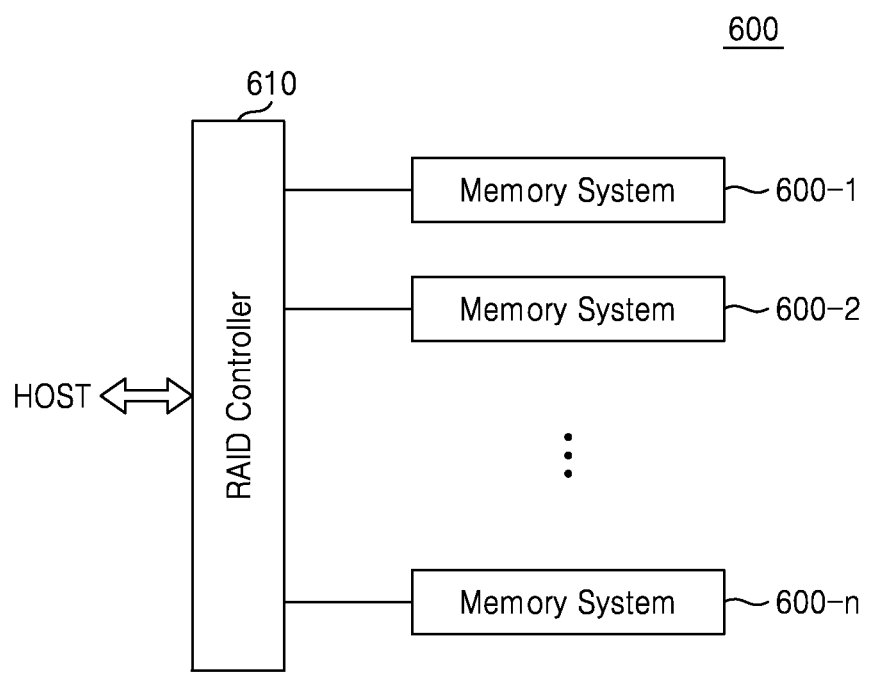
FIG. 11 is a block diagram of a data processing apparatus including the electronic memory apparatus illustrated in FIG. 10.

FIG. 11 is a block diagram of a data processing apparatus 600 including the electronic memory apparatus 500 illustrated in FIG. 10. Referring to FIGS. 10 and 11, the data processing apparatus 600 may be a redundant array of independent disks (RAID) system and include a RAID controller 610 and a plurality of memory systems 600-1 through 600-$n$.

Each of the memory systems 600-1 through 600-$n$ may be the electronic memory apparatus 500 illustrated in FIG. 10. The memory systems 600-1 through 600-$n$ may form a RAID array. The data processing apparatus 600 may be implemented by a PC or an SSD.

In a program operation, the RAID controller 610 may output program data received from a host to one of the memory systems 600-1 through 600-$n$ according to RAID level information. In a read operation, the RAID controller 610 may transmit data read from one of the memory systems 600-1 through 600-$n$ to the host according to the RAID level information.

As described above, according to some embodiments, a decoder adjusts a power consumption of a device, such as by adjusting the frequency of a clock signal provided to a Chien search circuit, based on information about the highest order term of an error location polynomial.

Figure 12:
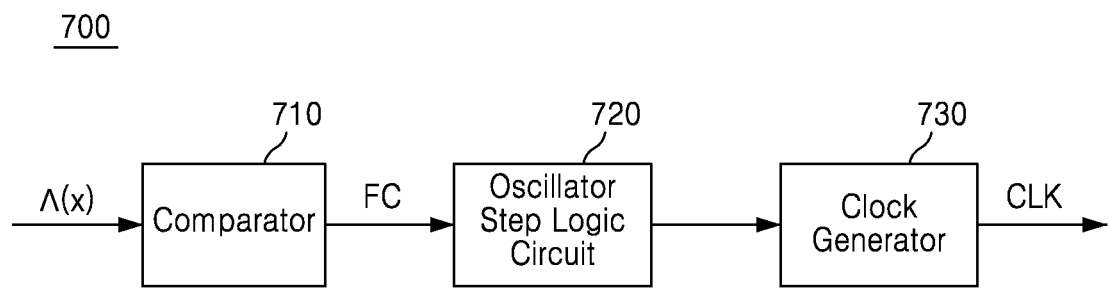
FIG. 12 is a block diagram of a frequency comparison circuit including a comparator 710, an oscillator step logic circuit 720 and a clock generator 730.

FIG. 12 is a block diagram of a frequency comparison circuit 700 according to another embodiment. The frequency comparison circuit 700 comprises a comparator 710, oscillator step logic circuit 720 and clock generator 730. The comparator 710 compares the current highest order term of the error location polynomial $\Lambda(x)$ with the previous highest order term of the error location polynomial $\Lambda(x)$ and outputs frequency comparison (FC) signal. The FC signal is fed to oscillator step logic circuit 720 to obtain frequency step (FS) signal. The FS signal is fed to clock generator 730 to provide clock signal (CLK).

Figure 13:
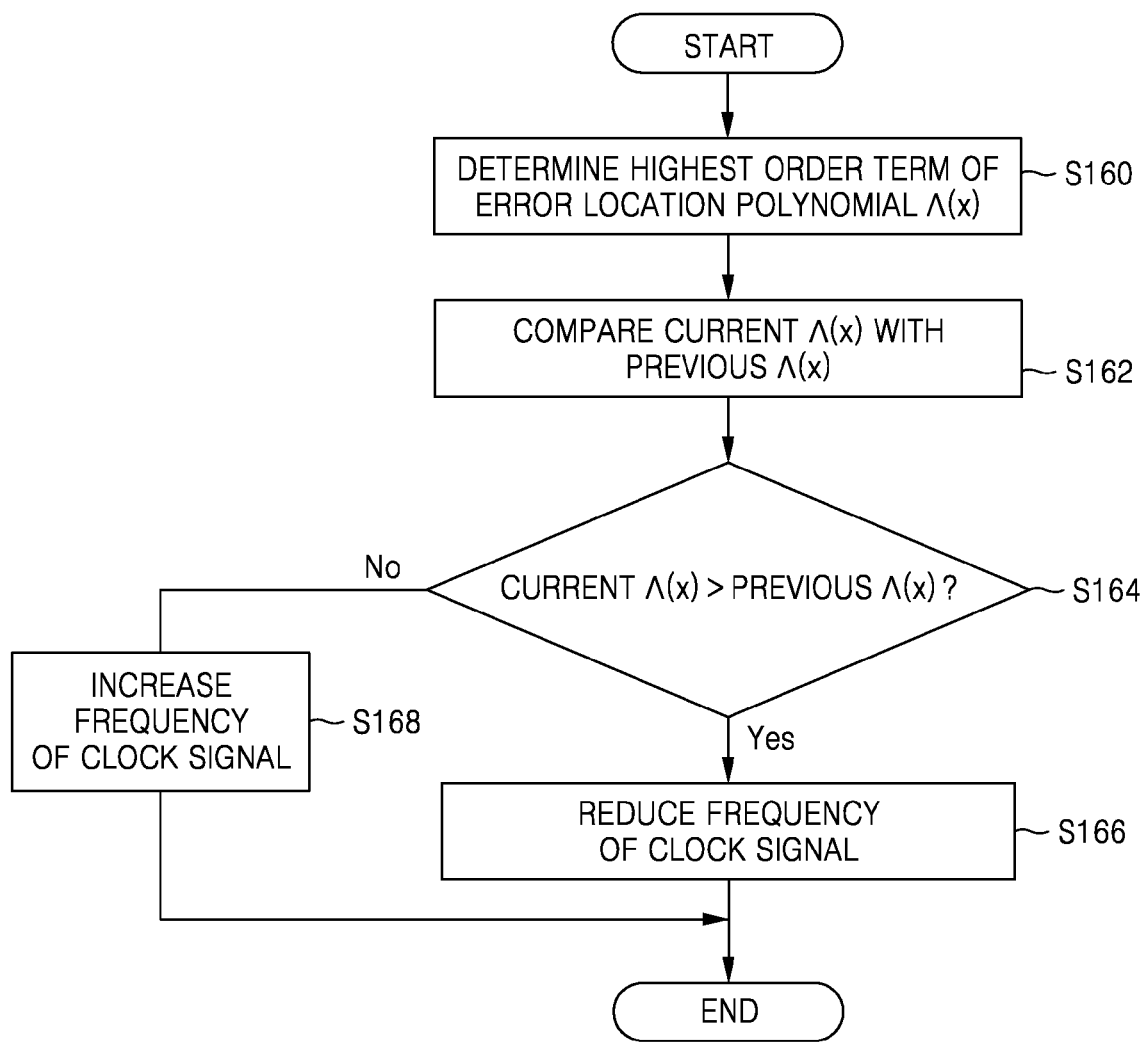
FIG. 13 is a flowchart illustrating the method for determining the frequency of a clock signal to be generated by a clock oscillator 50 using a frequency comparison circuit 700.

FIG. 13 is a flowchart of an operation of determining the frequency of a clock signal according to another embodiment. The frequency comparison circuit 700 illustrated in FIG. 12 may be configured to implement the operation of FIG. 13. Referring to FIG. 13, after the error location polynomial $\Lambda(x)$ has been determined, the highest order term of the error location polynomial $\Lambda(x)$ is determined in operation S160. In operation S162, the comparator 710 compares the current highest order term of the error location polynomial $\Lambda(x)$ with the previous highest order term of the error location polynomial $\Lambda(x)$. In operation S164, the result of the comparison of the current to the previous error location polynomial Λ(x) is determined. Then, if the current Λ(x) is greater than the previous Λ(x), the frequency of the clock signal CS is incrementally reduced in operation S166, but if the current Λ(x) is equal to or less than the previous Λ(x), the frequency of the clock signal CLK is incrementally increased in operation S168.

The above-disclosed subject matter is to be considered illustrative and not restrictive, and the claims are intended to cover all such modifications, enhancements, and other embodiments. Thus, to the maximum extent allowed by law, the scope is to be determined by the broadest permissible interpretation of the following claims and their equivalents, and shall not be restricted or limited by the foregoing detailed description.

What is claimed is:

1. A method of decoding, the method comprising:
calculating syndrome values from input codewords;
generating an error location polynomial about the codewords using the syndrome values;
determining an error count in the codewords using the error location polynomial;
determining a frequency of a clock signal based on the error count, the clock signal to be provided to a circuit configured to perform a Chien search; and
providing the clock signal having the determined frequency to the circuit configured to perform the Chien search,
wherein determining the frequency of the clock signal comprises determining the frequency of the clock signal to be a first frequency when the error count is a first value and determining the frequency of the clock signal to be a second frequency lower than the first frequency when the count value is a second value that is higher than the first value.

2. The method of claim 1, wherein the error count in the codewords is determined based on a highest order term of the error location polynomial.

3. The method of claim 1, wherein determining the frequency of the clock signal comprises changing the frequency of the clock signal to a reference frequency when a current frequency of the clock signal is higher than the reference frequency corresponding to the error count.

4. The method of claim 1, wherein determining the frequency of the clock signal comprises maintaining the frequency of the clock signal at a current frequency when the current frequency of the clock signal is equal to or lower than a reference frequency corresponding to the error count.

5. A decoder comprising:
a syndrome calculator circuit configured to calculate syndrome values from input codewords;
a key equation solver circuit configured to generate an error location polynomial about the codewords using the syndrome values; and
a main control logic circuit configured to determine an error count in the codewords using the error location polynomial and to determine a frequency of a clock signal based on the error count, the clock signal to be provided to a circuit configured to perform a Chien search, wherein the main control logic circuit is configured to determine the frequency of the clock signal to be a first frequency when the error count is a first value and to determine the frequency of the operating clock to be a second frequency lower than the first frequency when the error count is a second value that is higher than the first value.

6. The decoder of claim 5, wherein the main control logic circuit comprises:
a frequency adjustment logic circuit configured to determine the frequency of the clock signal based on the error count and generate frequency information from the determined frequency; and
an oscillator trimming logic circuit configured to receive the frequency information from the frequency adjustment logic circuit and generate a control signal for controlling a clock oscillator to generate the clock signal based on the frequency information.

7. The decoder of claim 6, wherein the frequency adjustment logic circuit determines the error count in the codewords using information about a highest order term of the error location polynomial.

8. A memory apparatus comprising:
a non-volatile memory configured to store codewords; and
a memory controller comprising a decoder comprising:
a syndrome calculator circuit configured to calculate syndrome values from input codewords;
a key equation solver circuit configured to generate an error location polynomial about the codewords using the syndrome values; and
a main control logic circuit configured to determine an error count in the codewords using the error location polynomial and to determine a frequency of a clock signal based on the error count, the clock signal to be provided to a circuit configured to perform a Chien search, wherein the main control to logic circuit is configured to determine the frequency of the clock signal to be a first frequency when the error count is a first value and to determine the frequency of the clock signal to be a second frequency lower than the first frequency when the error count is a second value that is higher than the first value.

9. The memory apparatus of claim 8, wherein the main control logic circuit comprises:
a frequency adjustment logic circuit configured to determine the frequency of the clock signal based on the error count and generate frequency information from the determined frequency; and
an oscillator trimming logic circuit configured to receive the frequency information from the frequency adjustment logic circuit and generate a control signal for controlling a clock oscillator to generate the clock signal based on the frequency information.

10. The memory apparatus of claim 9, wherein the frequency adjustment logic circuit determines the error count in the codewords using information about a highest order term of the error location polynomial.

11. An electronic apparatus comprising:
a memory apparatus;
a processor configured to control an operation of the memory apparatus comprising a non-volatile memory configured to store codewords; and
a memory controller comprising a decoder, wherein the decoder comprises:
a syndrome calculator circuit configured to calculate syndrome values from input codewords;
a key equation solver circuit configured to generate an error location polynomial about the codewords using the syndrome values; and
a main control logic circuit configured to determine an error count in the codewords using the error location polynomial and to determine a frequency of a clock signal based on the error count, the clock signal to be provided to a circuit configured to perform a Chien search, wherein the main control to logic circuit is configured to determine the frequency of the clock signal to be a first frequency when the error count is a first value and to determine the frequency of the clock signal to be a second frequency lower than the first frequency when the error count is a second value that is higher than the first value.

12. The electronic apparatus of claim 11, wherein the main control logic circuit comprises:

a frequency adjustment logic circuit configured to determine the frequency of the clock signal based on the error count and generate frequency information from the determined frequency; and an oscillator trimming logic circuit configured to receive the frequency information from the frequency adjustment logic circuit and generate a control signal for controlling a clock oscillator to generate the clock signal based on the frequency information.

13. The electronic apparatus of claim 12, wherein the frequency adjustment logic circuit determines the error count in the codewords using information about a highest order term of the error location polynomial.

14. The electronic apparatus of claim 11, wherein the electronic apparatus is a personal computer (PC), a tablet PC, a solid state drive (SSD), or a cellular phone.

* * * * *